United States Patent [19]

Thompson

[11] 3,835,406

[45] Sept. 10, 1974

[54] NEUTRALIZED AMPLIFIER CIRCUIT

[75] Inventor: Wallace T. Thompson, East Amherst, N.Y.

[73] Assignee: GTE Sylvania Incorporated, Stanford, Conn.

[22] Filed: Oct. 2, 1972

[21] Appl. No.: 293,911

[52] U.S. Cl. ........................ 330/27, 330/15, 330/28, 330/35, 330/107

[51] Int. Cl. ............................ H03f 1/14, H03f 3/16

[58] Field of Search .......... 307/320; 330/15, 25, 26, 330/27, 28, 30 D, 35, 107

[56] References Cited

UNITED STATES PATENTS

| | | | |
|---|---|---|---|
| 3,075,153 | 1/1963 | Dodd et al. | 330/30 R |
| 3,348,155 | 10/1967 | Von Recklinghausen | 330/28 X |
| 3,358,241 | 12/1967 | Hull | 330/15 |
| 3,528,021 | 9/1970 | Okasaki | 330/27 |
| 3,729,685 | 4/1973 | Linder | 307/320 X |

*Primary Examiner*—Herman Karl Saalbach
*Assistant Examiner*—Lawrence J. Dahl
*Attorney, Agent, or Firm*—David M. Keay; Elmer J. Nealon; Norman J. O'Malley

[57] ABSTRACT

A neutralized amplifier stage including a bipolar or a field effect transistor and having an output transformer. A variable capacitance diode is connected from the secondary winding of the transformer to the input electrode of the transistor. The capacitive effect of the diode varies with applied voltage thereby instantaneously balancing the internal capacitance of the transistor, which also varies with applied drive or B+ voltage, over a wide dynamic operating range.

6 Claims, 4 Drawing Figures

NEUTRALIZED AMPLIFIER CIRCUIT

BACKGROUND OF THE INVENTION

This invention relates to semiconductor amplifier circuits. More particularly, it is concerned with the neutralization of low noise, high gain transistor amplifiers.

Low noise, high gain amplifier stages typically require that the internal capacitance of the semiconductor amplifying device be neutralized in order to provide stability and a satisfactory noise figure for the amplifier stage. Neutralization may be obtained by the use of a capacitance connected in a feedback arrangement between the output and input electrodes of the amplifying device so as to balance the internal capacitance of the device. However, even though the internal capacitance may be properly balanced under certain operating conditions, the capacitive effect of the device typically increases with increasing signal voltage or decreasing supply voltage. Thus, under high-drive, low-supply conditions the feedback capacitance does not balance the internal capacitance of the device and the circuit may become unstable even though adequately neutralized at other levels of operation.

BRIEF SUMMARY OF THE INVENTION

An improved amplifier circuit in accordance with the invention which provides a satisfactory degree of neutralization over a wide dynamic range includes a semiconductive amplifying device having an input electrode and an output electrode. Such devices typically have an internal capacitive effect between the input and the output electrodes which varies with the voltage between them. The circuit also includes a variable capacitance diode of the type having a capacitive effect which varies with the voltage across the diode. The diode is coupled in a feedback arrangement between the output electrode and the input electrode of the semiconductive amplifying device. Thus, the internal capacitive effect of the semiconductive amplifying device is substantially neutralized over a wide dynamic range.

BRIEF DESCRIPTION OF THE DRAWINGS

Additional objects, features, and advantages of neutralized amplifier circuits in accordance with the present invention will be apparent from the following detailed discussion together with the accompanying drawings wherein.

DETAILED DESCRIPTION OF THE INVENTION

Figures 1, 2, 3:
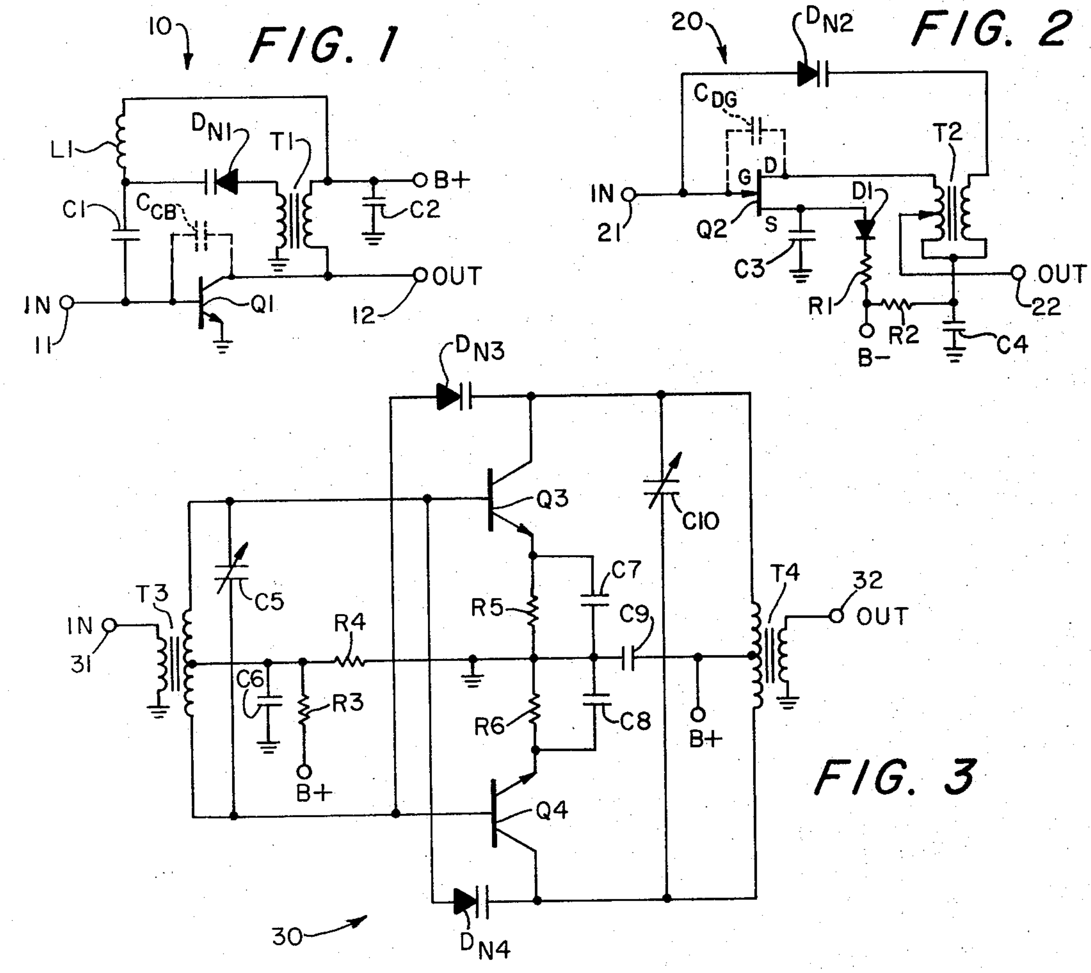
FIG. 1 is a schematic circuit diagram of an amplifier stage employing a bipolar transistor which is neutralized in accordance with the present invention.
FIG. 2 is a schematic circuit diagram of an amplifier stage employing a field effect type transistor neutralized in accordance with the present invention.
FIG. 3 is a schematic circuit diagram of a push-pull amplifier neutralized in accordance with the present invention.

FIG. 1 is a schematic circuit diagram of a single stage bipolar transistor amplifier 10. The circuit includes an NPN bipolar transistor Q1 having its base connected to an input terminal 11. Its emitter is connected directly to ground and its collector electrode is connected through the primary winding of an output transformer T1 to a B+ voltage source. A capacitance C2 is connected between the B+ voltage source and ground. An output terminal 12 is connected directly to the collector of the transistor Q1. An RF choke coil L1 and a capacitance C1 are connected in series between the B+ voltage source and the input terminal 11. A variable capacitance diode $D_{N1}$ of the type having a capacitive effect which varies with the voltage across its terminals is connected to the juncture of the coil L1 and capacitance C1 and to one end of the secondary winding of the transformer T1. The other end of the secondary winding of the transformer T1 is connected directly to ground.

The bipolar transistor Q1 inherently exhibits the phenomenon of internal capacitance between electrodes, or across junctions. The significant internal capacitive effect in an amplifier stage of the type illustrated is the capacitance $C_{CB}$ between the collector and the base, as illustrated in phantom in FIG. 1. This internal capacitance provides a feedback path from the output electrode of the transistor to the input electrode tending to cause unstable operation of the amplifier at high frequencies. The capacitive effect is not constant; that is, the value of the internal capacitance increases with decreasing collector-to-base voltage.

The feedback path from the output of the amplifier to its input provided by diode $D_{N1}$ balances the inherent capacitance $C_{CB}$. In effect an AC bridge circuit is provided having a first series circuit from the input terminal 11 to AC ground which includes the diode capacitance $D_{N1}$ plus the capacitance of C1 and the inductance of the secondary winding of transformer T1. A parallel series circuit between the input terminal 11 and AC ground is provided by the inherent internal capacitance $C_{CB}$ together with the primary winding of transformer T1. Diode $D_{N1}$ is chosen to have a nominal capacitance equal to the nominal internal capacitance of the transistor. With a variable capacitance diode $D_{N1}$ of the type described, the two series circuits remain balanced despite increases in the value of capacitance $C_{CB}$ with increases in signal voltage. Decreased B+ supply voltages also increase the capacitive effect of diode $D_{N1}$ maintaining the two series circuits balanced over a much wider dynamic range than would be achieved if diode $D_{N1}$ were of fixed capacitive value.

A single stage of an amplifier circuit 20 employing a field effect type transistor Q2 is illustrated in FIG. 2. As shown in FIG. 2, an input terminal 21 is connected directly to the gate G of the field effect transistor Q2. The source electrode S of the transistor is connected through a capacitance C3 to ground and through a diode D1 and a resistance R1 to a B– voltage source. The B– voltage source is also connected through a resistance R2 and a capacitance C4 to ground. The drain electrode D of transistor Q2 is connected through the primary winding of an output transformer T2 to the juncture of resistance R2 and capacitance C4. An output terminal 22 is connected to a tap on the primary winding of the transformer T2. A variable capacitance diode $D_{N2}$ is connected in a feedback arrangement from one terminal of the secondary winding of the transformer T2 to the gate electrode of the field effect transistor Q2. The other terminal of the secondary winding of transformer T2 is connected to the juncture of resistance R2 and capacitance C4.

An internal capacitive effect between the output electrode, the drain, and the input electrode, the gate, of the transistor is illustrated in phantom as capacitance $C_{DG}$ in FIG. 2. The capacitive effect of the internal capacitance $C_{DG}$ varies with voltage. Similarly, the diode $D_{N2}$ varies in capacitive effect with the voltage thereacross. Thus, a first AC series circuit between the input terminal 21 and AC ground including the internal capacitance $C_{DG}$ and the primary winding of transformer T2 is balanced by a parallel second AC series circuit including the feedback diode $D_{N2}$ and the secondary winding of transformer T2.

A push-pull type amplifier 30 in accordance with the present invention is illustrated in FIG. 3. An input terminal 31 is connected to one end of the primary winding of an input transformer T3. The other end of the primary winding is connected to ground. One end of the secondary winding of the transformer T3 is connected to the base of a first NPN transistor Q3, and the other end is connected to the base of a second NPN transistor Q4. A variable capacitor C5 is connected across the secondary winding of transformer T3 to provide a tuned input circuit. A center-tap of the secondary winding of transformer T3 is connected to ground through a capacitor C6, to a B+ voltage supply through a resistance R3, and to ground through a resistance R4.

The emitters of the first and second transistors Q3 and Q4 are connected to ground through resistances R5 and R6, respectively, and are also connected to ground through capacitors C7 and C8, respectively. The collectors of the two transistors are connected to opposite ends of the primary winding of an output transformer T4. A variable capacitor C10 is also connected across the primary winding to provide a tuned output circuit. A center-tap of the primary winding of the output transformer T4 is connected directly to the B+ voltage source and through a capacitor C9 to ground. One end of the secondary winding of the output transformer is connected to an output terminal 32, and the other end is connected to ground.

A first variable capacitance diode $D_{N3}$ is connected between the base of the second transistor Q4 and the juncture of the one end of the primary winding of the output transformer T4 and the collector of the first transistor Q3. A second variable capacitance diode $D_{N4}$ is connected between the base of the first transistor Q3 and the juncture of the other end of the primary winding of the output transformer T4 and the collector of the second transistor Q4. The variable capacitance diodes provide feedback arrangements from the output transformer T4 to the bases of the transistors. The capacitive values of the diodes vary with voltage thus compensating for the internal collector-to-base capacitive effects of the transistors which also vary with voltage. In the push-pull circuit arrangement with the variable capacitance diodes connected as shown, the need for balun transformer phase inversion is eliminated, thus extending the frequency range over which circuits may be implemented.

Amplifier circuits in accordance with the present invention, as illustrated in the figures, which employ variable capacitance diodes as feedback elements in neutralization arrangements exhibit instantaneous dynamic neutralization thus improving the dynamic range over which an amplifier may operate with stability and satisfactory noise figure.

As a specific example, an amplifier stage as illustrated in FIG. 1 may employ the following components:

| | | | |
|---|---|---|---|
| Q1 | 2N5016 | L1 | 10 $\mu$h |
| $D_{N1}$ | 1N5146 | T1 | 12-turn bifilar balun on Q1 core |
| C1 | .01 $\mu$f | B+ | 12 volts DC |
| C2 | .01 $\mu$f | | |

This amplifier operates with as much as 10 watts output which is higher than normal for this particular device using a 12 volts DC supply.

As another specific example, an amplifier stage as illustrated in FIG. 2 may employ the following components:

| | | | |
|---|---|---|---|
| Q2 | 2N4416A | D1 | 2 1N4531 in series |
| $D_{N2}$ | 1N4531 | T2 | 8-turn bifilar on CF101-Q1 core (supplied by Indiana General Co.) tap at first turn |
| R1 | 240 Ω | | |
| R2 | 1.1 kΩ | B– | –10 volts DC |
| C3 | .0047 $\mu$f | | |
| C4 | .01 $\mu$f | | |

Figure 4:
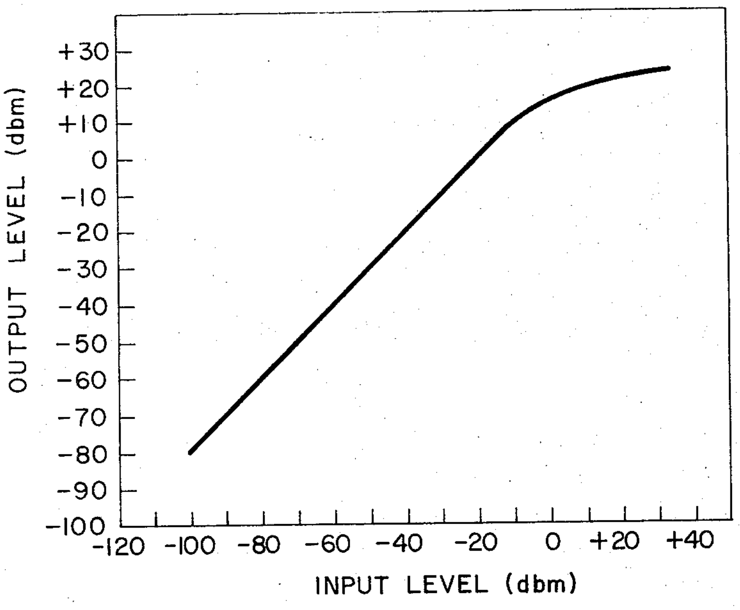
FIG. 4 is a graph illustrating the linearity characteristic of a particular circuit of the configuration shown in FIG. 2.

This amplifier operates with a 2 to 3 db noise figure providing the output linearity shown in FIG. 4. This combination of noise figure and output capability represents a wider dynamic range than that normally produced by low noise amplifiers.

While there has been shown and described what are considered preferred embodiments of the present invention, it will be obvious to those skilled in the art that various changes and modifications may be made therein without departing from the invention as defined in the appended claims.

What is claimed is:

1. A neutralized amplifier circuit including in combination a semiconductive amplifying device having an input electrode and an output electrode, said device having an internal capacitive effect between the input and output electrodes which varies with the voltage therebetween;

a variable capacitance diode having a capacitive effect which varies with the voltage across the diode, said diode being coupled between the output electrode and the input electrode of said semiconductive amplifying device whereby the internal capacitive effect of said semiconductive amplifying device is substantially neutralized over a wide dynamic range;

an output transformer having a primary winding and a secondary winding;

one of the windings of said transformer being coupled to the output electrode of said semiconductive amplifying device and to a point of AC reference potential whereby the capacitive effect of the semiconductive amplifying device and said one of the windings of said transformer provide a first AC series circuit between the input electrode of the semiconductive amplifying device and the point of AC reference potential; and the other of the windings of said transformer being coupled to the variable capacitance diode and to said point of AC reference potential whereby the variable capacitance diode and said other of the windings of said transformer provide a second AC series circuit between the input electrode of the semiconductive amplifying device and said point of AC reference potential.

2. A neutralized amplifier circuit in accordance with claim 1 wherein said semiconductive amplifying device is a bipolar transistor having emitter, base, and collector electrodes; and said base electrode is the input electrode and said collector electrode is the output electrode.

3. A neutralized amplifier circuit in accordance with claim 1 wherein said semiconductive amplifying device is a field effect transistor having source, drain, and gate electrodes; and said gate electrode is the input electrode and one of said remaining electrodes is the output electrode.

4. A neutralized amplifier circuit including in combination first and second semiconductive amplifying devices each having an input electrode and an output electrode, each of said devices having an internal capacitive effect between the input and output electrodes which varies with the voltage therebetween;

an input transformer having a primary winding and a secondary winding;

an output transformer having a primary winding and a secondary winding;

one end of the secondary winding of the input transformer being coupled to the input electrode of the first semiconductive amplifying device and the other end of the secondary winding of the input transformer being coupled to the input electrode of the second semiconductive amplifying device;

one end of the primary winding of the output transformer being coupled to the output electrode of the first semiconductive amplifying device and the other end of the primary winding of the output transformer being coupled to the output electrode of the second semiconductive amplifying device;

a first variable capacitance diode having a capacitive effect which varies with the voltage across the diode, said first diode being coupled between the one end of the primary winding of the output transformer and the input electrode of said second semiconductive amplifying device; and a second variable capacitance diode having a capacitive effect which varies with the voltage across the diode, said second diode being coupled between the other end of the primary winding of the output transformer and the input electrode of said first semiconductive amplifying device.

5. A neutralized amplifier circuit in accordance with claim 4 including a first capacitance connected across the secondary winding of the input transformer for providing therewith a tuned input circuit; and a second capacitance connected across the primary winding of the output transformer for providing therewith a tuned output circuit.

6. A neutralized amplifier circuit in accordance with claim 5 wherein each of said semiconductive amplifying devices is a bipolar transistor having emitter, base, and collector electrodes; and the base electrode of a transistor is the input electrode and the collector electrode of a transistor is the output electrode;

and including first impedance means connecting the emitter electrode of the first transistor to a source of reference potential; and second impedance means connecting the emitter electrode of the second transistor to the source of reference potential.

* * * * *